(12) United States Patent
Yamashita

(10) Patent No.: US 7,902,072 B2
(45) Date of Patent: *Mar. 8, 2011

(54) METAL-POLISHING COMPOSITION AND CHEMICAL-MECHANICAL POLISHING METHOD

(75) Inventor: Katsuhiro Yamashita, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 761 days.

This patent is subject to a terminal disclaimer.

(21) Appl. No.: 11/711,774

(22) Filed: Feb. 28, 2007

(65) Prior Publication Data

US 2008/0057716 A1 Mar. 6, 2008

(30) Foreign Application Priority Data

Feb. 28, 2006 (JP) ................. 2006-053823

(51) Int. Cl.
*H01L 21/302* (2006.01)
*H01L 21/461* (2006.01)

(52) U.S. Cl. .......... 438/690; 438/691; 438/692; 438/693

(58) Field of Classification Search ........................ None
See application file for complete search history.

(56) References Cited

U.S. PATENT DOCUMENTS

| | | | |
|---|---|---|---|
| 3,922,393 A * | 11/1975 | Sears, Jr. ................. 427/215 |
| 4,673,524 A | 6/1987 | Dean |
| 4,944,836 A | 7/1990 | Beyer et al. |
| 5,545,429 A | 8/1996 | Booth et al. |
| 5,795,695 A | 8/1998 | Malhotra et al. |
| 6,301,770 B1 | 10/2001 | McIlwraith |
| 6,485,812 B1 | 11/2002 | Sekiguchi |
| 6,527,818 B2 * | 3/2003 | Hattori et al. .................... 51/308 |
| 6,565,619 B1 | 5/2003 | Asano et al. |
| 6,893,476 B2 | 5/2005 | Siddiqui et al. |
| 7,118,685 B1 | 10/2006 | Yoneda et al. |
| 7,153,335 B2 | 12/2006 | Siddiqui et al. |
| 7,300,480 B2 | 11/2007 | Bian et al. |
| 7,309,684 B2 | 12/2007 | Filippini et al. |
| 7,514,363 B2 | 4/2009 | Banerjee et al. |
| 7,527,861 B2 | 5/2009 | Li et al. |
| 7,547,670 B2 | 6/2009 | Gross et al. |
| 7,604,751 B2 | 10/2009 | Yoneda et al. |
| 7,625,967 B2 | 12/2009 | St. Clair |
| 7,691,287 B2 | 4/2010 | Siddiqui et al. |
| 2002/0055562 A1 | 5/2002 | Butuc |
| 2003/0061766 A1 * | 4/2003 | Vogt et al. ........................ 51/308 |
| 2003/0157804 A1 | 8/2003 | Puppe et al. |
| 2004/0040217 A1 | 3/2004 | Takashina et al. |
| 2004/0044116 A1 | 3/2004 | Olson et al. |
| 2004/0109853 A1 | 6/2004 | McDaniel |
| 2004/0175407 A1 | 9/2004 | McDaniel |
| 2004/0186206 A1 | 9/2004 | Yoneda et al. |
| 2004/0244300 A1 | 12/2004 | Ichiki et al. |
| 2005/0076578 A1 | 4/2005 | Siddiqui et al. |
| 2005/0079718 A1 | 4/2005 | Siddiqui et al. |
| 2005/0090109 A1 | 4/2005 | Carter |
| 2005/0112892 A1 * | 5/2005 | Chen et al. ..................... 438/692 |
| 2005/0118821 A1 | 6/2005 | Minamihaba et al. |
| 2005/0142084 A1 | 6/2005 | Ganguly et al. |
| 2005/0208883 A1 | 9/2005 | Yoshida et al. |
| 2006/0117667 A1 | 6/2006 | Siddiqui et al. |
| 2006/0182788 A1 | 8/2006 | Singh et al. |
| 2006/0240672 A1 | 10/2006 | Yoneda et al. |
| 2007/0036738 A1 | 2/2007 | Fletcher et al. |
| 2007/0045233 A1 | 3/2007 | Yoneda et al. |
| 2007/0093187 A1 | 4/2007 | Takenouchi |
| 2007/0167016 A1 | 7/2007 | Yamashita |
| 2007/0176142 A1 | 8/2007 | Kikuchi |
| 2007/0181850 A1 | 8/2007 | Kamimura et al. |
| 2007/0186484 A1 | 8/2007 | Yamashita et al. |
| 2007/0275021 A1 | 11/2007 | Lee et al. |
| 2008/0057336 A1 | 3/2008 | Kurokawa et al. |
| 2008/0057716 A1 | 3/2008 | Yamashita |
| 2008/0182485 A1 | 7/2008 | Siddiqui et al. |
| 2009/0258060 A1 | 10/2009 | Cleary et al. |

FOREIGN PATENT DOCUMENTS

| | | |
|---|---|---|
| EP | 1813656 A2 | 8/2007 |
| JP | 49-122432 A | 11/1974 |
| JP | 63-123807 A | 5/1988 |
| JP | 2-278822 A | 11/1990 |
| JP | 6-199515 A | 7/1994 |
| JP | 08-083780 A | 3/1996 |
| JP | 11-186202 A | 7/1999 |
| JP | 2000084832 | 3/2000 |
| JP | 2001-127019 A | 5/2001 |
| JP | 2001-139935 A | 5/2001 |
| JP | 2001-279231 A | 10/2001 |
| JP | 2003-017446 | 1/2003 |
| JP | 2003142435 A | 5/2003 |
| JP | 2003-197573 A | 7/2003 |
| JP | 2005-175218 A | 6/2005 |
| JP | 2005-177970 A | 7/2005 |
| WO | 0104231 A1 | 1/2001 |
| WO | 2004/101221 A | 11/2004 |

OTHER PUBLICATIONS

Derwent 2005-515605 (Haba et al. JP 2005183684 Jul. 2005).*
Haba, S. et al., Metal-film Abrasive Compound for Polishing, Derwent Information Ltd., 2009, pp. 1-8.
European Search Report issued in EP 07002005.2 dated Jul. 30, 2009.

* cited by examiner

*Primary Examiner* — Duy-Vu N Deo
(74) *Attorney, Agent, or Firm* — Sughrue Mion, PLLC

(57) ABSTRACT

A metal-polishing composition includes colloidal silica particles, which has a ratio of minor axis/major axis of 0.2 to 0.8 and a surface at least partially covered with aluminum atoms, comprises in an amount of 50% or more with respect to total abrasives.
The metal-polishing composition preferably includes an oxidizing agent, an organic acid or the like. The colloidal silica constituting the colloidal silica particles is preferably formed by hydrolysis of alkoxysilane. The major axis of the colloidal silica particles is preferably in a range of 20 nm to 100 nm.

20 Claims, No Drawings

METAL-POLISHING COMPOSITION AND CHEMICAL-MECHANICAL POLISHING METHOD

CROSS REFERENCE TO RELATED APPLICATION

This application claims priority under 35 USC 119 from Japanese Patent Application No. 2006-053823, the disclosure of which is incorporated herein by reference herein.

BACKGROUND OF THE INVENTION

1. Field of the Invention

The present invention relates to the manufacturing of a semiconductor device, and specifically to a metal-polishing composition used in the wiring process of a semiconductor device for planarizing the semiconductor device, and a chemical-mechanical polishing method using the same.

2. Description of the Related Art

In the development of semiconductor devices, as represented by a large-scale integrated circuit (hereinafter, referred to as LSI), densification and enhancement of integration by poly-lamination of and formation of finer wiring have recently been demanded for the purpose of miniaturization and higher speed. For these purposes, a variety of techniques such as Chemical Mechanical Polishing (hereinafter, referred to as CMP) have been used. This CMP is an essential technique when surface flattening of processed films such as an interlayer insulating film, plug formation, formation of embedded metal wiring, or the like is carried out, and removes an extra metal thin film during substrate smoothing and wire formation.

A general CMP method involves sticking a polishing pad on a circular polishing platen, soaking the surface of the polishing pad with a polishing liquid, pushing the surface of a wafer on the pad, rotating both the polishing platen and the wafer under conditions of a specified pressure (polishing pressure) from the back surface side of the wafer, and flattening the wafer surface by means of generated mechanical friction.

The metal polishing liquid used for CMP commonly contains an abrasive (e.g., alumina, silica) and an oxidizing agent (e.g., hydrogen peroxide), and is considered to oxidize a metal surface with the oxidizing agent, and polish the surface by removing the oxide film with the abrasive.

However, when CMP is carried out using such a metal polishing liquid, problems may occur such as polishing scratches, excessive polishing of the entire polished surface (thinning), a phenomenon in which the polished metal surface is not planar and only the center is more deeply polished to form a dish-like hollow (dishing), and a phenomenon in which an insulator between metal wirings is excessively polished and a plurality of wired metal surfaces form a dish-like concave portion (erosion).

Conventionally, tungsten and aluminum have been generally used as metals for wiring in interconnection structures. With the aim of higher performance, however, LSIs have been developed in which copper having a wiring resistance lower than those of these metals is used. The Damascene method is known as a method of forming wiring with this copper. Additionally, the dual Damascene method has been widely used which involves simultaneously forming both a contact hole and a wiring groove in an interlayer insulating film, and embedding a metal in the both of these. A copper target having a high purity of five nine (99.999%) or more has been commercially available as a target material for the copper wiring. However, with recent formation of finer wiring aimed at further densification, improvements in the electrical conductivity, electronic properties and the like of copper wiring have become necessary. As such, the use of a copper alloy made by addition of a third component to highly pure copper has begun to be investigated. At the same time, high-speed metal-polishing methods capable of high productivity without contamination of these highly minute and highly purified materials are demanded. Polishing of a metal of copper readily generates the above-mentioned dishing, erosion or scratches due to its particular softness, and thus a polishing technique with higher precision is required.

Recently, for the purpose of increased productivity, the size of a wafer during LSI production has been increased more and more. Presently, a wafer having a diameter of 200 mm or more is widely used, and a wafer having a size of 300 mm or more has begun to be manufactured. With such an increase in the size of a wafer, a difference in polishing speed between the center portion and the peripheral portion of the wafer is easily generated, and demand with respect to uniformity in polishing within the wafer surface has become increasingly severe.

For copper and copper alloys, a metal polishing liquid which contains no abrasive and contains hydrogen peroxide, malic acid, benzotriazole, ammonium polyacrylate, and water is proposed in, for example, Japanese Patent Application Laid-Open (JP-A) No. 2003-127019. However, a chemical polishing method by means of chemical dissolution alone still has a major problem with respect to planarity of the polished surface because of excessive shaving in a concave portion, or dishing, in comparison with CMP in which a metal film of a convex portion is selectively subjected to chemical-mechanical polishing.

When using copper wiring, a dispersion preventing layer, called a barrier layer, is usually provided between the wiring portion and an insulating layer for the purpose of preventing dispersion of copper ions into an insulating material, and the barrier layer is made of one layer or two or more layers selected from TaN, TaSiN, Ta, TiN, Ti, Nb, W, WN, Co, Zr, ZrN, Ru and CuTa alloys. However, since these barrier materials themselves have electrical conductivity, the barrier material on the insulating layer must be completely removed for the sake of preventing error generation due to leaked current or the like. This removing processing is attained by a method similar to bulk polishing of a metal wiring material. In bulk polishing of copper, dishing is particularly liable to occur in a wide metal wiring portion, and therefore, it is desirable to adjust the amounts of polishing removal in the wiring portion and in the barrier portion for the purpose of achievement of final flattening. Because of this, a polishing liquid for barrier polishing desirably has the optimal polishing selectivity for copper/barrier metal. In addition, because the wiring pitch or wiring density differs in a wiring layer of each level, it is still more desirable to be capable of adjusting, as appropriate, the above-mentioned polishing selectivity.

Chemical-mechanical abrasive compounds used for CMP commonly contain, as discussed above, polishing particles such as alumina and silica. Accordingly, it is considered that the mechanical polishing force of the compounds is strongly exerted on the convex portion and weakly exerted on the concave portion on the surface, whereby the polishing rate is higher in the convex portion than in the concave portion, which results in planarization of the surface.

Furthermore, when a polishing liquid containing solid abrasives is used, there are problems concerning cost with respect to a washing process with usually follows the polishing process for removing residual polishing liquid on the semiconductor surface, such as the washing process being complicated and the necessity for sedimentation separation of the solid abrasives in the treatment of the liquid after washing (waste water).

As one means to solve these problems, for example, a metal surface polishing method by means of a combination of a polishing liquid that does not contain an abrasive and dry etching is disclosed in Journal of Electrochemical Society, Vol. 147, No. 10, pp. 3907-3913, 2000, etc. According to these methods, the metal films of the convex portions of a semiconductor substrate are selectively subjected to CMP, and metal films remain in concave portions, whereby a desired conductive pattern is obtained. Since CMP proceeds by means of friction against a polishing pad that is mechanically much softer than conventional materials containing solid abrasives, generation of scratches is reduced. Due to a decrease in mechanical polishing force, however, these methods have a disadvantage in that it is difficult to obtain a sufficient polishing speed.

On the other hand, a polishing agent containing an abrasive has a characteristic of obtaining a high polishing speed. In general, fine particles of inorganic oxides such as silica, alumina, ceria, titania, and zirconia are used as abrasives. These abrasives are known to have both advantages and disadvantages. For example, silica is comparatively soft and thus hardly generates scratches, but the polishing speed thereof is not sufficient. On the other hand, alumina is hard and offers a high polishing speed, but it is liable to generate scratches and causes a problem of instability over time due to particle aggregation. Further, although a composite abrasive in which surfaces of silica are covered with alumina is disclosed in, for example, JP-A No. 2003-197573, it does not sufficiently exhibit the advantages of silica and alumina.

SUMMARY OF THE INVENTION

A first embodiment of the invention is a metal-polishing composition, comprising abrasives containing a colloidal silica particle which has a ratio of minor axis/major axis of 0.2 to 0.8 and a surface at least partially covered with aluminum atoms in an amount of 50% or more with respect to a total number of abrasives A second embodiment of the invention is a chemical-mechanical polishing method comprising: supplying the metal-polishing composition according to the first embodiment to a polishing pad on a polishing platen; rotating the polishing platen; relatively moving the polishing pad while the polishing pad is contacted with a surface to be polished of a object to be polished; and polishing the surface to be polished of the object to be polished.

DETAILED DESCRIPTION OF THE INVENTION

The inventors of the present invention have exerted an intensive study on problems concerning the above-described metal-polishing composition and, as a result, has found that these problems can be solved by using colloidal silica having a high aspect ratio and a modified surface as the abrasive, and has completed the present invention.

The particular embodiment of the present invention is described below. In the present specification " . . . to . . . " represents a range including the numeral values represented before and after "to" as a minimum value and a maximum value, respectively.

The metal-polishing composition according to the present invention contains an abrasive having a high aspect ratio shape and specific surface characteristics, and an oxidizing agent, which will be further described later. If desired, the composition further contains known additives commonly used in metal-polishing compositions, such as an organic acid and a heterocyclic aromatic ring compound.

<Colloidal Silica Particles Having a Ratio of Minor Axis/Major Axis of 0.2 to 0.8 and a Surface at Least Partially Covered with Aluminum Atoms>

Among the total number of abrasive particles used in the metal-polishing composition according to the present invention, 50% or more are colloidal silica particles, which have a ratio of minor axis/major axis of 0.2 to 0.8 and a surface at least partially covered with aluminum atoms (hereinafter sometimes referred to as specific colloidal silica). The term "major axis" refers to the largest particle diameter in the colloidal silica particles (primary particles). The term "minor axis" refers to the largest particle diameter of the diameters perpendicular to the major axis. The ratio of minor axis/major axis of the particles in the present invention is determined by ascertaining the shape of the entire particle with an electron photomicrograph of the abrasive, and then arithmetical average values of major axis and minor axis of the 100 or more particle obtained by observing the particle from the direction in which the major axis is confirmed as the "major axis" and the "minor axis".

The ratio is determined individually for 100 or more particles. The ratio of minor axis/major axis of the particles must be in the range of 0.2 to 0.8, and preferably 0.3 to 0.6, for 50% or more of the total abrasive particles.

The amount of the specific particles having such a minor axis/major axis ratio is preferably 70% or more of the total particles, and more preferably 90% or more of the total particles. All of the abrasive particles may have the above-described shape.

The shape of the particles having a ratio of minor axis/major axis of 0.2 to 0.8 is optional as long as the particles have the minor axis/major axis ratio, and may be, for example, a spindle shape, a cocoon shape, or a plate shape, and the particles may be amorphous particles.

The colloidal silica particles having a shape with a ratio of minor axis/major axis of 0.2 to 0.8 which can be preferably used in the present invention for preparing the specific colloidal silica is commercially available. Examples thereof include colloidal silica manufactured by Fuso Chemical Co., Ltd., trade name: PL-1SL (major axis: 15 nm, minor axis: 8 nm, minor axis/major axis: 0.53), PL-2 (major axis: 25 nm, minor axis: 10 nm, minor axis/major axis: 0.4), PL-3 (major axis: 35 nm, minor axis: 11 nm, minor axis/major axis: 0.31), PL-5 (major axis: 55 nm, minor axis: 14 nm, minor axis/major axis: 0.25), PL-7 (major axis: 70 nm, minor axis: 17 nm, minor axis/major axis: 0.24), and PL-10 (major axis: 100 nm, minor axis: 20 nm, minor axis/major axis: 0.2).

The specific colloidal silica is not spherical, as discussed above, but rather has a high aspect ratio shape, and the surface thereof is partially covered with aluminum atoms.

In the present invention, "colloidal silica having a surface partially covered with aluminum" refers to a state in which aluminum atoms are present on a surface of a colloidal silica having sites containing silicon atoms having a coordination number of four. The state may be a state in which aluminum atoms having four oxygen atoms contained thereto are bound to the surface of the colloidal silica, and the aluminum atoms are fixed in a 4-coordinated state to generate a new surface, or a state in which the silicon atoms on the surface are once removed and replaced with the aluminum atoms to generate a new surface.

The colloidal silica used for the preparation of the specific colloidal silica is more preferably a colloidal silica prepared by hydrolysis of alkoxysilane with no inclusion of impurity such as alkali metals within the particles. Other colloidal silica prepared by removing alkalis from an alkaline silicate aqueous solution can be also used, but in this case, residual alkali metals within the particles may be gradually eluted to affect the polishing performance. Accordingly, the former colloidal silica prepared by hydrolysis of alkoxysilane is more preferable as a raw material.

Examples of the method for preparing the specific colloidal silica by substituting the silicon atoms on the surface of colloidal silica particles with aluminum atoms include a method of adding an aluminate compound such as ammonium aluminate into a dispersion liquid of the above-described colloidal silica having a specific shape. More specific examples of the method include a method of heating a silica sol obtained by adding an aqueous solution of an alkali aluminate at 80 to 250° C. for 0.5 to 20 hours, followed by contact with a cation exchange resin or cation and anion exchange resins alternately; or a method of dealkalizing an aluminum compound-containing alkaline silica sol with a cation exchange resin, wherein the aluminum compound-containing alkaline silica sol is prepared by (1) a method of adding an acidic silicic acid solution and an aluminum compound aqueous solution into a $SiO_2$-containing alkali aqueous solution or an alkali metal hydroxide aqueous solution; or (2) a method of adding an acidic silicic acid solution containing an aluminum compound into a $SiO_2$-containing alkali aqueous solution or an alkali metal hydroxide aqueous solution. These methods are described in detail in Japanese Patents No. 3463328, and JP-A No. 63-123807. These descriptions can be applied to the present invention.

Additionally, as another method, it is prefer to apply a method of adding an aluminum alkoxide into a dispersion solution of colloidal silica.

While the kind of aluminum alkoxides is not particularly restricted, aluminum alkoxide is preferably aluminum isopropoxide, aluminum butoxide, aluminum methoxide, or aluminum ethoxide, and more preferably aluminum isopropoxide or aluminum butoxide.

In the specified colloidal silica, a tetracoordinate aluminate ion reacts with a silanol group on the surface of colloidal silica to form an aluminosilicate site, which immobilizes a negative charge and imparts a large zeta potential to a particle, and thus is excellent in dispersing ability even under acidity. Hence, it is important that the specified colloidal silica produced by an above-described method includes an aluminum atom coordinated by 4 oxygen atoms.

This structure in which silicon atoms are substituted by aluminum atoms on the surface of the colloidal silica can be readily confirmed by the measurement of the zeta potential of the abrasives.

For the amount of substitution of silicon atoms on the surface of the colloidal silica for aluminum atoms, the percentage of substitution of surface atoms of the colloidal silica (number of introduced aluminum atoms/number of surface silicon atom sites) is preferably 0.001% to 50%, more preferably 0.01% to 25%, and furthermore preferably 0.1% to 10%.

When silicon atoms on the surface of the colloidal silica are substituted for aluminum atoms, the amount of substitution for aluminum atoms may be controlled, as appropriate, by control of the amount (concentration) of an aluminate compound, an aluminum alkoxide or the like added into the dispersion solution of colloidal silica.

The amount of aluminum atoms introduced to the surface of the colloidal silica (number of introduced aluminum atoms/number of silicon atom sites on the surface) is calculated on the presumption that 100% of sodium aluminate and aluminum tetramethoxide, which was added and consumed, had been used for reaction. The (number of introduced aluminum atoms/number of silicon atom sites on the surface) is calculated from the surface area converted from the diameter of colloidal silica, a specific gravity of colloidal silica of 2.2, and the number of silicon atoms per surface area of $13/nm^2$. Actual measurement is carried out by subjecting the obtained colloidal silica to elemental analysis and using the surface area/specific gravity of the colloidal silica, and the number of silanol groups per unit surface area, based on the presumption that the aluminum is not present within the particles but is uniformly and thinly spread on the surface.

A specific method of manufacture involves, for example, dispersing 1 to 50% by mass of colloidal silica in water, adding a pH adjusting agent ininto the dispersion solution to adjust the pH of 7 to 11, adding an aqueous ammonium aluminate solution to the resulting solution at about room temperature, agitating the solution at the same temperature for 1 to 10 hours, and subsequently removing impurities by ion exchange, ultrafiltration, or the like to obtain the specified colloidal silica.

For twenty or more particles arbitrarily selected from the colloidal silica particles (primary particles), the arithmetic averages of the above-described "major axis" and "minor axis" are determined respectively. As this time, the average value of the major axis is preferably 5 nm to 300 nm, more preferably 10 nm to 200 nm, and particularly preferably 20 nm to 100 nm. The minor axis is appropriately selected under the condition that the "minor axis/major axis ratio" is between 0.2 and 0.8.

The content of the specific colloidal silica in the metal-polishing composition according to the present invention is preferably 0.001% by weight or more and 8% by weight or less, more preferably 0.01% by weight or more and 5% by weight or less, and most preferably 0.05% by weight or more and 2% by weight or less with respect to the total polishing composition.

The specific colloidal silica in the present invention work as an abrasive. 50% by weight or more must be the specific colloidal silica based on the total abrasive used in the composition according to the present invention, and preferably 80% or more. The whole of the contained abrasive may be the specific colloidal silica.

A metal-polishing liquid according to the present invention can contain, in addition to the above-mentioned specified colloidal silica, abrasives other than the specified colloidal silica as long as being not deviated from the effect of the present invention. The abrasives used here preferably include fumed silica, colloidal silica, ceria, alumina, titania or the like, and more preferably colloidal silica.

The size of abrasives other than the specified colloidal silica is preferably once to twice size of the above-mentioned specified colloidal silica.

The pH of the polishing composition of the present invention is preferably 2 to 7.

<Oxidizing Agent>

The metal-polishing liquid according to the present invention contains an oxidizing agent.

The oxidizing agents include, for example, hydrogen peroxide, peroxides, nitrates, iodates, periodates, hypochlorites, chlorites, chlorates, perchlorates, persulfates, dichromates, permanganates, ozone water, silver(II) salts, and ferric(III) salts.

Ferric(III) salts that are preferably used include, for example, inorganic ferric(III) salts such as iron(III) nitrate, iron(III) chloride, iron(III) sulfate, and iron(III) bromide, and organic complex salts of iron(III).

For the use of organic complex salts of iron(III), complex-forming-compounds which constitute iron(III) complex salts include, for example, acetic acid, citric acid, oxalic acid, salisylic acid, diethyldithiocarbanic acid, succinic acid, tartaric acid, glycolic acid, glycine, alanine, asparaginic acid, thioglycolic acid, ethylene diamine, trimethylene diamine, diethylene glycol, triethylene glycol, 1,2-ethanedithiol, malonic acid, glutaric acid, 3-hydroxybutylic acid, propionic acid, phthalic acid, isophthalic acid, 3-hydroxysalisylic acid, 3,5-dihydroxysalisylic acid, gallic acid, benzoic acid, maleic acid, and salts thereof, and aminopolycarbonic acids and salts thereof.

Aminopolycarbonic acids and salts thereof include ethylenediamine-N,N,N',N'-tetraacetic acid, diethylenetriaminepentaacetic acid, 1,3-diaminopropane-N,N,N',N'-tetraacetic acid, 1,2-diaminopropane-N,N,N',N'-tetraacetic acid, ethylenediamine-N,N'-disuccinic acid (racemic form), ethylenediamine disuccinic acid (SS form), N-(2-carboxylate ethyl)-L-asparaginic acid, N-(carboxymethyl)-L-asparaginic acid, β-alaninediacetic acid, methyliminodiacetic acid, nitrilotriacetic acid, cyclohexanediaminetetraacetic acid, iminodiacetic acid, glycol ether diaminetetraacetic acid, ethylenediaminel-N,N'-diacetic acid, ethylenediamineorthohydroxyphenylacetic acid, N,N-bis(2-hydroxybenzyl)ethylenediamine-N,N-diacetic acid and the like and salts thereof. Kinds of pair salts are preferably alkaline metal salts and ammonium salts, and more preferably ammonium salts.

Among the oxidizing agents, hydrogen peroxide, iodates, hypochlorites, chlorates, persulfates, and organic complex salts of iron(III) are preferable. Preferable complex-forming-compounds for the use of organic complex salts of iron(III) can include citric acid, tartaric acid, or aminopolycarbonic acids (specifically, ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemic form), ethylenediaminedisuccinic acid (SS form), N-(2-carboxylate ethyl)-L-asparaginic acid, N-(carboxymethyl)-L-asparaginic acid, β-alaninediacetic acid, methyliminodiacetic acid, nitrilotriacetic acid, and iminodiacetic acid).

Among the oxidizing agents, hydrogen peroxide is most preferable.

The amount of an oxidizing agent added into the metal-polishing liquid (metal-polishing composition) is preferably 0.003 mol to 8 mol, more preferably 0.03 mol to 6 mol, and furthermore preferably 0.1 mol to 4 mol, based on 1 L of a metal-polishing liquid when the oxidizing agent is used for polishing. The amount of an oxidizing agent added is preferably 0.003 mol or more from the viewpoint of sufficient oxidation of a metal and a high CMP speed, and preferably 8 mol or less from the viewpoint of preventing roughness of a surface to be polished.

<Organic Acid>

The metal-polishing composition according to the present invention preferably contains an organic acid in addition to the above-described abrasive or oxidizing agent.

Most preferable examples of the organic acid include the compound represented by the following Formula (A), and the composition preferably contains the compound.

$$R^1-OOC-(CH_2)_m-COO-R^2 \qquad \text{Formula (A):}$$

In the Formula (A), $R^1$ and $R^2$ each independently represent a hydrogen atom, an alkyl group, an alkynyl group, an alkenyl group, an allyl group, or an aryl group.

The alkyl group is preferably a methyl group, an ethyl group, a propyl group, a butyl group, or an octyl group, and more preferably a methyl group. The aryl group is preferably a phenyl group or a pyridyl group, and more preferably a phenyl group. $R^1$ and $R^2$ are not simultaneously a hydrogen atom.

$R^1$ and $R^2$ may have further substituent. Examples of the preferable substituent include an alkyl group, a hydroxy group, an amino group, an alkoxy group, and a nitro group. $R^1$ and $R^2$ are most preferably a hydrogen atom or a methyl group.

m is an integer of from 0 to 6, preferably and integer of from 2 to 4, and most preferably 4.

The metal-polishing composition according to the present invention preferably contains a plurality kinds of the compound represented by Formula (A), and more preferably contains both compounds, which m is the same and either $R^1$ or $R^2$ is different, together.

Other examples of the preferable organic acid contained in the metal-polishing composition according to the present invention include the compound represented by the following Formula (B), and the composition preferably contains the compound.

$$R^3-O-(CH_2CH_2-O-)n-SO_3H \qquad \text{Formula (B):}$$

In the Formula (B), $R^3$ represents an alkyl group or an aryl group, preferably a phenyl group, and more preferably a phenyl group substituted with an alkyl group. The substituent of the phenyl group is preferably an alkyl group, and most preferably an alkyl group having 5 to 15 carbon atoms.

n represents an integer of from 1 to 30, and preferably an integer of from 10 to 20.

Examples of the preferable organic acid contained in the metal-polishing composition according to the present invention include a compound having within the molecule at least one carboxyl group and at least one amino group. It is preferable that the composition contains the compound, and it is more preferable that at least one of the amino groups of the compound is secondary or tertiary. Preferable examples of the compound include α-amino acids such as glycine, alanine, valine, and glutamic acid, β-amino acids such as β-alanine, iminodiacetic acid, hydroxyethyliminodiacetic acid, hydroxyethyl glycine, dihydroxyethyl glycine, glycyl glycine, and N-methyl glycine. The composition more preferably contains two or more kinds of the compound having within the molecule at least one carboxyl group and at least one amino group, and most preferably contains both a compound having within the molecule only one carboxyl group and a compound having within the molecule two or more carboxyl groups together.

The addition amount of compound having within the molecule at least one carboxyl group and at least one amino group is preferably from 0.1 wt % to 5 wt %, and more preferably 0.5 wt % to 2 wt %.

As another preferable example of the organic acid, the compound having within the molecule at least one amino group and at least one sulfo group is preferably contained. Examples of the compound include aminomethanesulfonic acid and taurine. Among them, taurine is preferable. The amount of the compound having within the molecule at least one amino group and at least one sulfo group is added preferably in an amount of from 0.1 wt % to 10 wt %, and more preferably 1 wt % to 5 wt %.

<Heterocyclic Compound>

A metal-polishing liquid according to the present invention preferably contains at least one kind of heterocyclic compounds as a compound forming a passive film on a metal surface of a polishing object.

Herein, a "heterocyclic compound" refers to a compound having a heterocyclic ring containing one or more of heteroatoms. Heteroatoms mean atoms other than a carbon atom and a hydrogen atom. A heterocyclic atom means a cyclic compound having at least one heteroatom. A heteroatom means an atom forming a constituent of the cyclic system of a heterocyclic ring, and does not mean an atom positioned outside the ring, separated from the ring system through at least one non-conjugated single bond, and being a part of an additional substituent of the ring system.

Heterocyclic atom is preferably a nitrogen atom, a surfer atom, an oxygen atom, a selenium atom, a tellurium atom, a phosphorus atom, a silicon atom or a boron atom, more preferably a nitrogen atom, a sulfur atom, an oxygen atom or a selenium atom, furthermore preferably a nitrogen atom, a sulfur atom or an oxygen atom, and still more preferably a nitrogen atom or a sulfur atom.

First, a heterocyclic ring to be main structure will be set forth.

A number of the ring members of the heterocyclic ring of the heterocyclic compound is not particularly limited. Both a single ring compound and a polycyclic compound having a condensed ring are acceptable. The number of members for a single ring is preferably 3 to 8, more preferably 5 to 7, and furthermore preferably 5 or 6. The number of rings when a heterocyclic compound has a condensed ring is preferably 2 to 4, and more preferably 2 or 3.

These heterocyclic rings specifically include the following. However, they are not limited thereto.

A pyrrole ring, a thiophene ring, a furan ring, a pyrane ring, a thiopyrane ring, a imidazole ring, a pyrazole ring, a thiazole ring, an isothiazole ring, an oxazole ring, an isoxazole ring, a pyridine ring, a pyradine ring, a pyrimidine ring, a pyridazine ring, a pyrrolidine ring, a pyrazolidine ring, an imidazolidine ring, an isoxazolidine ring, an isothiazolidine ring, a piperidine ring, a piperadine ring, a morpholine ring, a thiomorpholine ring, a chroman ring, a thiochroman ring, an isochroman ring, an isothiochroman ring, an indoline ring, an isoindoline ring, a pilindine ring, an indolizine ring, an indole ring, an indazole ring, a purine ring, a quinolizine ring, an isoquinoline ring, a quinoline ring, a naphthylidine ring, a phthalazine ring, a quinoxaline ring, a quinazoline ring, a cinnoline ring, a pteridine ring, an acridine ring, a pyrimidine ring, a phenanthroline ring, a carbazole ring, a carboline ring, a phenazine ring, an antilysine ring, a thiadiazole ring, an oxadiazole ring, a triazine ring, a triazole ring, a tetrazole ring, a benzoimidazole ring, a benzoxazole ring, a benzothiazole ring, a benzothiadiazole ring, a benzofuroxan ring, a naphthoimidazole ring, a benzotriazole ring, a tetraazaindene ring or the like, and more preferably include a triazole ring or a tetrazole ring.

Next, substituent, that the above-mentioned heterocyclic ring may have, will be described.

In the present invention, when a specified portion is referred to as a "group", the case means that the portion itself may not be substituted, or may be substituted by one or more kinds (a possible maximum number or less) of substituents. For example, an "alkyl group" means a substituted or non-substituted alkyl group.

The substituents capable of being used in a heterocyclic compound used in the present invention include, for example, the following. However, they are not limited thereto.

Halogen atoms (a fluorine atom, a chlorine atom, a bromine atom, or an iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (substituted site is not restricted), acyl groups, alkoxycarbonyl groups, aryloxycarbonyl groups, heterocyclic oxycarbonyl groups, carbamoyl groups (carbamoyl groups having a substituent include, for example, an N-hydroxycarbamoyl group, N-acylcarbamoyl group, N-sulfonylcarbamoyl group, N-carbamoylcarbamoyl group, thiocarbamoyl group, and N-sulfamoylcarbamoyl group), carbazoyl groups, carboxyl groups or salts thereof, oxalyl groups, oxamoyl groups, cyano groups, carboneimidoyl groups, formyl groups, hydroxy groups, alkoxy groups (include groups containing a repeating unit of ethyleneoxy group or propyleneoxy group), aryloxy groups, heterocycloxy groups, acyloxy groups, (alkoxy or aryloxy)carbonyloxy groups, carbamoyloxy groups, sulfonyloxy groups, amino groups, (alkyl, aryl, or heterocyclo)amino groups, acylamino groups, sulfonamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quaternized nitrogen atom (e.g., a pyridinio group, imidazolio group, quinolionio group, isoquinolionio group), isocyano groups, imino groups, mercapto groups, (alkyl, aryl, or heterocyclo)thio groups, (alkyl, aryl, or heterocyclo)dithio groups, (alkyl or aryl)sulfonyl groups, (alkyl or aryl)sulfanyl groups, sulfo groups or salts thereof, sulfamoyl groups (sulfamoyl groups having a substituent include, for example, an N-acylsulfamoyl group and N-sulfonylsulfamoyl group) or salts thereof, phosphino groups, phosphinyl groups, phosphinyloxy groups, phosphinylamino groups, and silyl groups or the like.

The above-mentioned active methane group means a methine group substituted by two electron withdrawing groups; the electron withdrawing group means, for example, an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group, and a carboneimidoyl group. The two electron withdrawing groups may be linked each other to form a cyclic structure. The salt means a cationic ion such as an alkaline metal; alkali earth metal, or heavy metal; and an organic cationic ion such as an ammonium ion or phosphonium ion.

Among them, preferable substituents include, for example, halogen atoms (a fluorine atom, a chlorine atom, a bromine atom, or an iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (substituted site is not restricted), acyl groups, alkoxycarbonyl groups, aryloxycarbonyl groups, heterocyclic oxycarbonyl groups, carbamoyl groups, N-hydroxycarbamoyl groups, N-acylcarbamoyl groups, N-sulfonylcarbamoyl groups, N-carbamoylcarbamoyl groups, thiocarbamoyl groups, N-sulfamoylcarbamoyl groups, carbazoyl groups, oxalyl groups, oxamoyl groups, cyano groups, carboneimidoyl groups, formyl groups, hydroxy groups, alkoxy groups (include groups containing a repeating unit of ethyleneoxy group or propyleneoxy group), aryloxy groups, heterocycloxy groups, acyloxy groups, (alkoxy or aryloxy)carbonyloxy groups, carbamoyloxy groups, sulfonyloxy groups, (alkyl, aryl, or heterocyclo)amino groups, acylamino groups, sulfonamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quaternized nitrogen atom (e.g., a pyridinio group, imidazolio group, quinolionio group, isoquinolionio group), isocyano groups, imino groups, mercapto groups, (alkyl, aryl, or heterocyclo)thio groups, (alkyl, aryl, or heterocyclo)dithio groups, (alkyl or aryl)sulfonyl groups, (alkyl or aryl)sulfinyl groups, sulfo groups or salts thereof, sulfamoyl groups, N-acylsulfamoyl groups, N-sulfonylsulfamoyl groups or salts thereof, phosphino groups, phosphinyl groups, phosphinyloxy groups, phosphinylamino groups, silyl groups, carboxyl groups or the like.

Furthermore preferable substituents include, for example, halogen atoms (a fluorine atom, a chlorine atom, a bromine atom, or an iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (regardless of substituted sites) or the like.

Two of the above-described substituents may be linked together to form a ring. Examples of the thus formed ring include aromatic or non-aromatic hydrocarbon ring, and heterocycles. These rings may be further combined to form a polycyclic condensed ring. Examples thereof include benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolysine ring, indole ring, benzofuran ring, benzothiophene ring, isobenzofuran ring, quinolizine ring, quino line ring, phthalazinering, naphthyridine ring, quinoxaline ring, quinoxazoline ring, isoquinoline ring, carbazole ring, phenanthridinering, acridine ring, phenanthroline ring, thianthrene ring, chromene ring, xanthene ring, phenoxathiin ring, phenothiazine ring, and phenazine ring.

The heterocyclic compound used in the present invention may be used alone or in combination of two or more of them. The heterocyclic compound used in the present invention may be synthesized according to a common procedure, or may be a commercial product.

The total content of heterocyclic compounds used in the present invention is preferably in the range of from 0.0001 to 1.0 mol, more preferably in the range of 0.0005 to 0.5 mol, and furthermore preferably in the range of 0.0005 to 0.05 mol, based on 1 L of the metal polishing liquid used for polishing (when diluted with water or an aqueous solution, the metal polishing liquid after dilution).

Among these heterocyclic aromatic ring compounds as the passive layer forming agent, a heterocyclic aromatic ring compound having within the molecule three or more nitrogen atoms and having a condensed ring structure is preferable. A heterocyclic aromatic ring compound having within the molecule four or more nitrogen atoms is also preferable.

These preferable specific heterocyclic aromatic ring compounds preferably have a functional group selected from carboxyl group, sulfo group, hydroxy group, and alkoxy group. The addition amount of the specific heterocyclic aromatic ring compound having a carboxyl group, sulfo group, hydroxy group, or alkoxy group is preferably from 0.0001 wt % to 0.005 wt %, and more preferably 0.0005 wt % to 0.002 wt %.

The followings are specific examples [exemplary compound (I-1) to (I-16)] of the heterocyclic aromatic ring compound having within the molecule three or more nitrogen atoms and having a condensed ring structure, and the heterocyclic aromatic ring compound having within the molecule four or more nitrogen atoms which are most preferably used in the present invention.

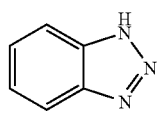

I-1

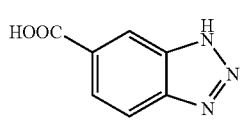

I-2

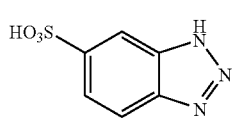

I-3

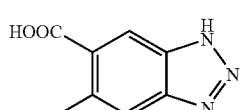

I-4

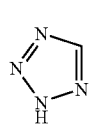

I-5

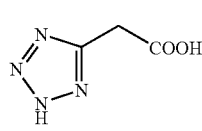

I-6

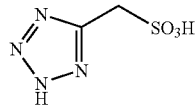

I-7

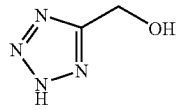

I-8

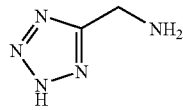

I-9

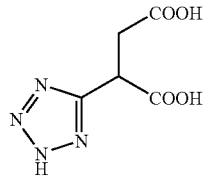

I-10

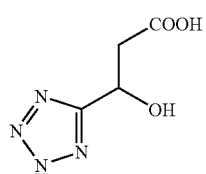

I-11

-continued

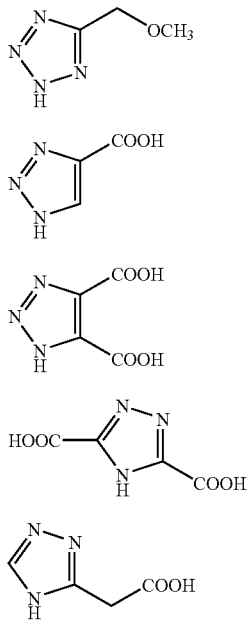

Preferable examples of the heterocyclic aromatic ring compound contained in the metal-polishing composition according to the present invention include a nitrogen-containing heterocyclic aromatic ring compound. Specific examples of the preferable nitrogen-containing heterocyclic aromatic ring compound include benzotriazole and cyanuric acid. In the present invention, it is most preferable to contain both benzotriazole and cyanuric acid.

Other preferable examples of the heterocyclic aromatic ring compound include a heterocyclic aromatic ring compound having within the molecule three or more nitrogen atoms and having a condensed ring structure, and a heterocyclic aromatic ring compound having within the molecule four or more nitrogen atoms. It is also preferable to contain these compounds. These preferable heterocyclic aromatic ring compounds preferably have within one or more kinds of functional groups selected from the group consisting of a carboxyl group, a sulfo group, a hydroxy group, and an alkoxy group.

The addition amount of these preferable heterocyclic aromatic ring compounds is preferably from 0.0001 wt % to 0.005 wt %, and more preferably 0.0005 wt % to 0.002 wt % with respect to the metal-polishing composition.

The metal-polishing composition according to the present invention may contain, in addition to the above-described components, various compounds according to the object.

<Quaternary Alkyl Ammonium Compounds>

A metal-polishing liquid according to the present invention preferably contains a quaternary alkyl ammonium compound. Quaternary alkyl ammonium compounds include tetramethyl ammonium hydroxide, tetramethyl ammonium nitrate, tetraethyl ammonium hydroxide, tetraethyl ammonium nitrate, stearin trimethyl ammonium nitrate or the like, and more preferably trimethyl ammonium hydroxide.

The content of quaternary alkyl ammonium compound is preferably from 0.01% by mass to 20% by mass, more preferably from 0.1% by mass to 5% by mass, and furthermore preferably from 0.5% by mass to 2% by mass with respect to the metal-polishing composition.

<Water-Soluble Polymer>

A metal-polishing composition according to the present invention preferably contains a water soluble polymer. Water soluble polymers that can be preferably used include ammonium polyacrylate, polyvinyl alcohol, succinamide, polyvinyl pyrrolidone, polyethylene glycol, and polyoxyethylene-polyoxypropylene block copolymers.

The total addition amount of water soluble polymers added to the metal-polishing liquid is preferably 0.001 to 10 g, more preferably 0.01 to 5 g, and furthermore preferably 0.1 to 3 g, based on 1 L of a metal-polishing liquid upon the use in polishing. The addition amount of a hydrophilic polymer is preferably 0.001 g or more from the viewpoint of obtaining a sufficient effect, and preferably 10 g or less from the viewpoint of preventing
a decrease in CPM speed. Additionally, the weight average molecular weight of these hydrophilic polymers is preferably 500 to 100000, and more preferably 2000 to 50000.

The metal-polishing composition according to the present invention preferably contains no inorganic component other than the abrasive, but if contains any, the inorganic component is preferably a phosphate or phosphate.

In the metal-polishing composition according to the present invention, the type, addition amount, or pH of the above-described compound is preferably determined according to the adsorptivity and reactivity for the polishing surface, solubility of the metal to be polished, electrochemical properties of the surface to be polished, dissociation condition of the functional group of the compound, and stability as a solution. The pH of the metal-polishing composition according to the present invention is, as aforementioned, preferably in the range of from 2 to 7, and more preferably in the range of from 4 to 6.

<Chemical-Mechanical Polishing Method>

A metal-polishing liquid (metal-polishing composition) according to the present invention is applied to a chemical-mechanical polishing method described in detail below (hereinafter, also referred to as a "CMP method" or a "polishing method"). That is, the method involves contacting a metal-polishing liquid according to the present invention with a surface to be polished, relatively moving the surface to be polished and the polishing surface, and polishing a substrate having metal wiring formed therein to remove at least a portion of the metal.

The processed bodies to be a polishing object may include all materials which are required for flattening in any stages of manufacturing semiconductor device, such as a wafer having an electrically conductive film formed on the supporting substrate thereof and a laminate having an electrically conductive material film formed on a low dielectric insulating film (interlayer insulating film) disposed on wiring formed on the supporting substrate.

[Low Dielectric Insulating Film]

A low dielectric insulating film, which is an object to be polished, will be set forth. Conventionally, $SiO_2$ (relative dielectric constant: approximately 4.1) has been used as an interlayer insulating material of a semiconductor device. The dielectric constant of a low dielectric constant insulating film material in the present invention is defined to be 3.0 or less.

A low dielectric constant insulating film used in the present invention may be made of an organic or inorganic material, and preferably an organic-inorganic hybrid material such as SiOC or MSQ; or an organic polymer such as polyimide or Teflon (registered trade name). These materials may have fine pores.

The film forming method may be plasma CVD or spin coating. The dielectric constant is preferably lower, and more preferably 1.8 to 2.5. Specific examples include "Black Diamond (manufactured by Materials Inc., trade name)" by applying SiOC-plasma CVD method and "SiLK (manufactured by Dow Chemical Company, trade name)" of organic polymer.

[Wiring Metal Raw Materials]

In the present invention, a semiconductor to be a object to be polished is preferably a large-scale integrated circuit (hereinafter, as appropriate, designated by LSI) having a wiring comprised of a copper metal and/or copper alloy, more preferably a copper alloy, and furthermore preferably a copper alloy containing silver among copper alloys. The silver content contained in a copper alloy is preferably 40% by mass or less, more preferably 10% by mass or less, furthermore preferably 1% by mass or less; a copper alloy having a silver content of 0.00001 to 0.1% by mass has the most excellent effect.

[Width of Wiring]

In the present invention, in a semiconductor to be a object to be polished, for example in DRAM device systems, the half pitch of wiring in LSIs is preferably 0.15 μm or less, more preferably 0.10 μm or less, and furthermore preferably 0.08 μm or less, while the half pitch in MPU device systems is preferably 0.12 μm or less, more preferably 0.09 μm or less, and furthermore preferably 0.07 μm or less. For these LSIs, a polishing liquid of the present invention has particularly excellent effect.

[Barrier Metal]

In the present invention, a barrier metal layer is preferably disposed between a wiring, which is comprised of a copper metal and/or copper alloy and an interlayer insulating film, from the viewpoint of preventing diffusion of copper. The material constituting a barrier metal layer is suitably a metal material having a low resistance, more preferably TiN, TiW, Ta, TaN, W, or WN, and furthermore preferably Ta or TaN among them.

[Polishing Method]

The metal-polishing liquid may be a concentrated liquid, or may be prepared as a working solution. The liquid is diluted with water before use to make a working solution, or the components are mixed in a form of aqueous solution, which will be described in the following section, and as necessarily diluted with water to make a working solution. The polishing method using the polishing liquid of the present invention can be applied to any of these cases. The polishing method using the metal-polishing liquid according to the present invention can be applied to any case, and comprises a method of supplying a polishing liquid to a polishing pad on a polishing platen, contacting the polishing pad with a surface to be polished, and polishing the surface by relative movement between an surface to be polished and a polishing pad.

As the polishing apparatus, a common polishing apparatus having a polishing platen to which a polishing pad and a holder for holding a semiconductor substrate or the like having a surface to be polished have been attached (equipped with a variable-speed motor and others) can be used. The polishing pad is not particularly limited, and common nonwoven cloth, foamed polyurethane, and porous fluorocarbon resins can be used. The polishing conditions are not limited, but the rotation rate of the polishing platen is preferably 200 rpm or less for preventing the substrate from flying out. The pressing pressure of the semiconductor substrate having a surface to be polished (layer to be polished) against the polishing pad is preferably 10 to 600 hPa, and more preferably 20 to 250 hPa for satisfying the uniformity of the polishing rate and the evenness of the pattern in the same wafer surface.

During polishing, the polishing liquid is continuously fed to the polishing pad using a pump or the like. The feeding rate is not limited, but is preferably in a rate so as to the surface of the polishing pad is continuously covered with the polishing liquid. The semiconductor substrate after completion of polishing is thoroughly washed in running water, and dried after shaking off water droplets on the semiconductor substrate using a spin dryer or the like. In the polishing method of the present invention, the aqueous solution used for dilution is the same as the aqueous solution described below. The aqueous solution is water to which at least one of an oxidizing agent, an acid, an additive, and a surfactant has been added in advance. The total of the ingredients added to the aqueous solution and the ingredients of the polishing liquid before dilution shall be the ingredients of the polishing liquid in usable form. When the polishing liquid is used after diluting with an aqueous solution, poorly soluble ingredients can be added in the form of aqueous solution, thus a more concentrated polishing liquid can be prepared.

The methods of adding water or an aqueous solution to a concentrated polishing liquid includes a method of joining a pipe supplying a concentrated polishing liquid and a pipe supplying water or an aqueous solution on the way and blending them, and then supplying the blended, diluted polishing liquid to the polishing pad. Methods of mixing that can be adopted include methods of being usually carried out such as a method of mixing by collision of each liquid through a narrow pathway under conditions of pressure application, a method of performing the repetition of branching, separating and joining the flow of a liquid that passes through a pipe having a filler such as glass tubes packed therein, and a method of providing blades rotated by a powder within a pipe.

The speed of supply of a polishing liquid is preferably 10 to 1000 ml/min, more preferably 100 to 500 l/min in order to satisfy the uniformity of a polishing speed within the wafer surface and pattern flattening.

The methods of diluting a concentrated polishing liquid with water, an aqueous solution or the like and polishing include a method of independently providing a pipe supplying a polishing liquid and a pipe supplying water or an aqueous solution; supplying specified amounts of the liquids from the respective pipes to the polishing pad; and moving relatively between the polishing pad and the surface to be polished to polish. Another method is a method of introducing a specified amount of a concentrated polishing liquid and water or an aqueous solution into one vessel and mixing; and then supplying its mixed polishing liquid to the polishing pad and polishing.

Another metal-polishing method of the present invention is a method of separating a component to be contained in a polishing liquid into at least two constituents; when using the constituents, diluting them with water or an aqueous solution; supplying the resulting constituents to the polishing pad on the polishing platen; contacting them with a surface to be polished and polishing; and moving relatively between the surface to be polished and the polishing pad.

For example, an oxidizing agent is selected as one constituent (A); and an acid, additive, surfactant and water are selected as constituent (B). When they are used, the constituent (A) and the constituent (B) are diluted with water or an aqueous solution for use.

In still another method, additives having low solubility are divided into two constituents (A) and (B). An oxidizing agent, additive and surfactant are selected as one constituent (A); and an acid, additive, surfactant and water are selected as one constituent (B). When they are used, the constituent (A) and the constituent (B) are diluted with water or an aqueous solution for use. For this example, three pipes are needed that supply the constituent (A), the constituent (B) and water or an aqueous solution. For dilution and mixing, the three pipes are connected to one pipe that supplies a polishing liquid, and mixing is carried out within the pipe. In this case, it is also possible that two pipes are connected and then another pipe is connected thereto.

For example, another method includes mixing a constituent containing a hardly soluble additive and another constituent; ensuring a dissolution period of time by elongation of the mixing pathway; and then furthermore connecting a pipe of water or an aqueous solution. The other mixing methods include a method of leading the three respective pipes as described above to the polishing pad; and moving relatively between the polishing pad and the surface to be polished: and a method of mixing three constituents in one vessel; and then supplying the diluted polishing liquid to the polishing pad. In the above-described polishing methods, it is also possible that one constituent containing an oxidizing agent is made to be 40° C. or lower, and that another constituent is heated to a range of room temperature to 100° C., and that when one constituent and another constituent or water or an aqueous solution are mixed and diluted for use, the resulting solution is made to be 40° C. or lower. This is a preferable method for increasing the solubility of a raw material having a low solubility of a polishing liquid because raising a temperature renders solubility to increase.

A raw material made by dissolution of another component not containing an oxidizing agent by application of heat at a range of room temperature to 100° C. precipitates in the solution when the temperature is decreased. Thus, when the component the temperature of which is lowered is used, the precipitate needs to be dissolved by application of heat in advance. This makes it possible to adopt means of transporting a constituent liquid dissolved by application of heat and means of agitating a liquid containing a precipitate and dissolving it by application of heat to the pipe during transport of the liquid. When the temperature of one constituent having a heated component containing an oxidizing agent is raised to 40° C. or higher, there is a fear of decomposition of the oxidizing agent. Hence, when the heated constituent and one constituent containing an oxidizing agent that cools the heated constituent are blended, the temperature of the mixture is made to be 40° C. or lower.

In the present invention, the component of a polishing liquid may be separated into two or more separated solutions as described above, and then be supplied to a surface to be polished. In this case, components that are separated into a component containing an oxide and a component containing an acid are preferably supplied. In addition, a concentrated liquid of a polishing liquid and water for dilution may also be separately supplied to a surface to be polished.

[Pad]

A pad for polishing may be either a non-foamed structure pad or a foamed structure pad. The former uses a hard synthetic resin bulk material like a plastic plate for a pad. The latter is furthermore classified into three categories: a closed cell foam (dry foam material), an open cell foam (wet foam material), and a two-layer composite (laminate material). In particular, the two-layer composite (laminate material) is preferable. Foaming may be either uniform or non-uniform.

The pad may also further contain abrasives for polishing (e.g., ceria, silica, alumina, resin, etc.). They each are a soft or hard pad; both are acceptable. In a laminate, a different hardness is preferably used for each layer. The material is preferably unwoven fabric, artificial leather, polyamide, polyurethane, polyester, polycarbonate, or the like. In addition, the surface attached to a surface to be polished may be subjected to processing of lattice grooves, holes, concentric grooves, spiral grooves or the like.

[Wafer]

A subject wafer on which CMP is performed with the metal-polishing liquid according to the present invention has a diameter of preferably 200 mm or more, more preferably 300 mm or more. When a diameter is 300 mm or more, the effect of the present invention is remarkably exerted.

EXAMPLES

The present invention is further illustrated by following Examples. The present invention is not limited to these Examples.

<Preparation of Specific Colloidal Silica>

500 g each of 20% by weight aqueous dispersions were prepared using a colloidal silicas having a ratio of minor axis/major axis and a major axis as shown in Table 1. Sodium hydroxide was added to the dispersions to adjust the pH to 9.5, subsequently a 1% by weight ammonium aluminate aqueous solution was added over a period of 5 minutes thereto under stirring at room temperature, and further stirred for 3 hours after the addition.

Furthermore, 500 g of a 20% by weight aqueous dispersion was prepared using a similar colloidal silica having a ratio of minor axis/major axis of 0.4 and a major axis of 30 nm. Ammonia was added to the dispersion to adjust the pH to 9.5, subsequently an ethanol solution of 1% by weight aluminum isopropoxide was slowly added to the dispersion over a period of 1 hour under a condition of cooling with ice water.

After the completion of the addition, the liquid temperature of these dispersions was brought to room temperature, stirring was further continued for 10 hours, and the liquids were washed by ultrafiltration and ion exchange. Thus a colloidal silica abrasive having a ratio of minor axis/major axis as shown in Table 1 and having a surface partially covered with aluminum was prepared.

<Preparation of Spherical Colloidal Silica>

In the same manner as above, 500 g of a 20% by weight aqueous dispersion of a colloidal silica having an average particles diameter of 50 nm was prepared, and in the same manner as above, an ammonium aluminate aqueous solution or an ethanol solution of aluminum isopropoxide was added to the dispersion, thus a spherical colloidal silica abrasive having a surface partially covered with aluminum was prepared in the same manner.

The ratio of minor axis/major axis of the colloidal silicas used for these preparations was determined for each particle on the basis of transmission electron micrographs, using the longest diameter of the particle as the major axis, and the longest diameter in the direction orthogonal to the major axis as the minor axis, and the ratio of 300 particles was determined by statistical processing.

<Preparation of Colloidal Silica Abrasive>

The colloidal silica particles having a ratio of minor axis/major axis of 0.2 to 0.8 and a surface partially covered with aluminum obtained as aforementioned was mixed with a spherical colloidal silica having a surface partially covered with aluminum in such manner that the content proportion in the abrasive is the proportion listed in Table 1. Thus abrasives (A-1) to (A-5) were obtained. The abrasive (A-5) is a comparative abrasive which has a ratio of minor axis/major axis of 0.2 to 0.8, and the content proportion of the colloidal silica abrasive having a surface partially covered with aluminum is out of the range of the present invention.

TABLE 1

| Name of abrasive | Ratio of minor axis/major axis | Major axis of colloidal silica (nm) | Proportion of particles having a ratio of minor axis/major axis of 0.2 to 0.8 (%) | Surface modifier |
|---|---|---|---|---|
| A-1 | 0.4 | 25 | 72 | Sodium aluminate |
| A-2 | 0.4 | 25 | 72 | Aluminum tetraisopropoxide |
| A-3 | 0.33 | 33 | 52 | Sodium aluminate |
| A-4 | 0.31 | 35 | 97 | Sodium aluminate |
| A-5 | 0.4 | 25 | 30 | Sodium aluminate |

The amount of substituted silicon atoms on the surface of the colloidal silica was calculated on the presumption that 100% of sodium aluminate and aluminum tetramethoxide, which was added and consumed, had been used for reaction. The amount of substituted atoms on the surface of the colloidal silica (number of introduced aluminum atoms/number of silicon atom sites on the surface) was calculated from the surface area converted from the diameter of colloidal silica, a specific gravity of colloidal silica of 2.2, and the number of silicon atoms per surface area of $13/nm^2$, and determined as the amount equal to 1%.

<Preparation of Metal-Polishing Composition>

The metal-polishing compositions of Examples 1 to 12 and Comparative Example 1 were prepared having the following composition, using the abrasives (A-1) to (A-4) of the present invention containing a specified amount of the above-described specific colloidal silica, and the comparative abrasive (A-5) containing the specific colloidal silica in an amount out of the range of the present invention.

The pH of the compositions was adjusted with ammonia and nitric acid.

Examples 1 to 12

Comparative Example 1

Metal-Polishing Composition

Abrasive (particles listed in Table 2) (Concentration listed in Table 2)
Hydrogen peroxide (oxidizing agent) 1% by weight
Benzotriazole (heterocyclic aromatic ring compound) 1 g/L
(Example 8 does not contain benzotriazole.)
Additive (compound listed in Table 2) (Amount listed in Table 2)
Whole amount adjusted with pure water 1000 mL
pH (adjusted with ammonia water and nitric acid) (pH listed in Table 2)

TABLE 2

| | Abrasive type | Abrasive concentration (% by weight) | pH | Additive and addition amount | In-plane uniformity of polishing rate (%) * | In-plane uniformity of polishing rate (%) ** |
|---|---|---|---|---|---|---|
| Example 1 | A-1 | 3 | 4.1 | Tricine: 5 g/L | 15 | 12 |
| Example 2 | A-2 | 3 | 4.1 | Tricine: 5 g/L | 13 | 10 |
| Example 3 | A-3 | 3 | 4.1 | Tricine: 5 g/L | 19 | 11 |
| Example 4 | A-4 | 3 | 4.1 | Tricine: 5 g/L | 14 | 12 |
| Example 5 | A-4 | 3 | 4.1 | Dihydroxyethyl glycine: 5 g/L | 16 | 16 |
| Example 6 | A-4 | 3 | 4.1 | Dihydroxyethyl glycine: 5 g/L | 12 | 14 |
| Example 7 | A-4 | 3 | 4.1 | β-alanine: 2 g/L | 15 | 14 |
| Example 8 | A-4 | 3 | 4.1 | β-alanine: 2 g/L<br>Compound (I-5): 0.05 g/L | 19 | 18 |
| Example 9 | A-4 | 3 | 4.1 | Dimethyl adipate: 2 g/L<br>Monomethyl adipate: 1.5 g/L<br>Adipic acid: 1.5 g/L<br>Cyanuric acid: 0.05 g/L | 12 | 15 |
| Example 10 | A-4 | 3 | 4.1 | Dimethyl adipate: 2 g/L<br>Monomethyl adipate: 1.5 g/L<br>Adipic acid: 1.5 g/L<br>Cyanuric acid: 0.05 g/L<br>Phosphorous acid: 2 g/L | 13 | 17 |
| Example 11 | A-4 | 10 | 4.1 | Dimethyl adipate: 2 g/L<br>Monomethyl adipate: 1.5 g/L<br>Adipic acid: 1.5 g/L<br>Cyanuric acid: 0.05 g/L<br>Phosphorous acid: 2 g/L | 10 | 15 |
| Example 12 | A-4 | 3 | 8 | Dimethyl adipate: 2 g/L<br>Monomethyl adipate: 1.5 g/L<br>Adipic acid: 1.5 g/L<br>Cyanuric acid: 0.05 g/L<br>Phosphorous acid: 2 g/L | 20 | 14 |
| Comparative Example 1 | A-5 | 3 | 4.1 | Dimethyl adipate: 2 g/L<br>Monomethyl adipate: 1.5 g/L<br>Adipic acid: 1.5 g/L<br>Cyanuric acid: 0.05 g/L<br>Pphosphorous acid: 2 g/L | 26 | 20 |

\* Table rotation number: 50 rpm
\*\* Table rotation number: 100 rpm

<Evaluation of Polishing Performance>

Under the following conditions, layers provided on each wafer was polished with a polishing machine (trade name: LGP-613, manufactured by Lapmaster SFT Corp.) by supplying a slurry.

Wafer: 8-inch silicon wafer with copper layer
Table rotation number: 50 rpm or 100 rpm
Head rotation number: 1% more than the table rotation number
Polishing pressure: 168 hPa
Polishing pad:
Product number IC-1400, manufactured by Rodel Nitta Company
Slurry feeding rate: 200 ml/minute

[In-Plane Uniformity of Polishing Amount]

The average polishing rate at 49 points on a surface of the wafer was determined from the difference of the metal film thickness between before and after CMP respectively by converting from the electric resistance, and the variation in the polishing rate in the same surface was determined from the average, maximum and minimum polishing rete using the following formula.

[(Maximum Polishing Rate−Minimum Polishing Speed)/(Average Polishing Rate×2)]×100(%)

The results are listed in Table 2.

From the results listed in Table 2, it was confirmed that when the metal-polishing composition according to the present invention was used, excellent in-plane uniformity of the polishing rate was achieved at both the table rotation numbers of 50 rpm and 100 rpm, and the polishing property was less varied under different polishing conditions.

On the other hand, in Comparative Example 1: which was prepared by the same method as Examples 10 and 12, except that abrasives was changed to abrasives out of the range of the present invention; it was shown that the in-plane uniformity of the polishing rate remarkably varied with the change of the table rotation number.

The foregoing description of the embodiments of the present invention has been provided for the purposes of illustration and description. It is not intended to be exhaustive or to limit the present invention to the precise forms disclosed. Obviously, many modifications and variations will be apparent to practitioners skilled in the art. The embodiments were chosen and described in order to best explain the principles of the present invention and its practical applications, thereby enabling others skilled in the art to understand the present invention for various embodiments and with the various modifications as are suited to the particular use contemplated. It is intended that the scope of the present invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A metal-polishing composition, comprising abrasives containing a colloidal silica particle which has a ratio of minor axis/major axis of 0.2 to 0.8 and a surface at least partially covered with aluminum atoms in an amount of 50% or more with respect to a total number of the abrasives, wherein the percentage of substitution of surface atoms of the colloidal silica for aluminum atoms (number of introduced aluminum atoms/number of surface silicon atom sites) is 0.1% to 1%.

2. The metal-polishing composition according to claim 1, wherein the colloidal silica particle is formed through a process of hydrolysis of alkoxysilane.

3. The metal-polishing composition according to claim 1, wherein the colloidal silica particle has an average major axis in the range of 20 nm to 100 nm.

4. The metal-polishing composition according to claim 1, further containing an oxidizing agent.

5. The metal-polishing composition according to claim 1, wherein the colloidal silica particle is comprised at a concentration of 0.001 to 8% by weight in the metal-polishing composition.

6. The metal-polishing composition according to claim 1, further comprising an organic acid.

7. The metal-polishing composition according to claim 6, wherein the organic acid comprises a compound represented by the following Formula (A):

$$R^1—OOC—(CH_2)m-COO—R^2 \qquad \text{Formula (A)}$$

wherein in the Formula (A), $R^1$ and $R^2$ each independently represent a hydrogen atom, an alkyl group, an alkynyl group, an alkenyl group, an allyl group, or an aryl group, and m represents an integer of from 0 to 6.

8. The metal-polishing composition according to claim 6, wherein the organic acid comprises a compound represented by the following Formula (B):

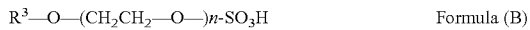

$$R^3—O—(CH_2CH_2—O—)n\text{-}SO_3H \qquad \text{Formula (B)}$$

wherein in the Formula (B), $R^3$ represents an alkyl group or an aryl group, and n represents an integer of from 1 to 30.

9. The metal-polishing composition according to claim 6, wherein the organic acid comprises a compound having at least one carboxyl group and at least one amino group within the molecule.

10. The metal-polishing composition according to claim 9, wherein at least one amino group of the compound having at least one carboxyl group and at least one amino group within the molecule is a secondary or tertiary amino group.

11. The metal-polishing composition according to claim 9, wherein:
at least one amino group of the compound having at least one carboxyl group and at least one amino group within the molecule is a secondary or tertiary amino group; and
the compound having at least one carboxyl group and at least one amino group within the molecule further comprises at least one of a hydroxy group, a cyano group or an alkoxy group.

12. The metal-polishing composition according to claim 6, wherein the organic acid comprises a compound having at least one amino group and at least one sulfo group within the molecule.

13. The metal-polishing composition according to claim 1, further comprising a nitrogen-containing heterocyclic aromatic ring compound.

14. The metal-polishing composition according to claim 13, wherein the nitrogen-containing heterocyclic aromatic ring compound comprises benzotriazole.

15. The metal-polishing composition according to claim 13, wherein the nitrogen-containing heterocyclic aromatic ring compound comprises cyanuric acid.

16. The metal-polishing composition according to claim 13, wherein the nitrogen-containing heterocyclic aromatic ring compound comprises a compound having four or more nitrogen atoms within the molecule.

17. The metal-polishing composition according to claim 16, wherein the compound having four or more nitrogen atoms within the molecule further comprises at least one of a carboxyl group, a sulfo group, a hydroxy group or an alkoxy group.

18. The metal-polishing composition according to claim 1, further comprising phosphoric acid or phosphorous acid.

19. A chemical-mechanical polishing method comprising:
supplying the metal-polishing composition according to claim 1 to a polishing pad on a polishing platen,
rotating the polishing platen,
relatively moving the polishing pad while the polishing pad is contacted with a surface to be polished of a object to be polished, and
polishing the surface to be polished of the object to be polished.

20. The chemical-mechanical polishing method according to claim 19, wherein an amount of the metal-polishing liquid supplied to the polishing pad is 100 to 500 ml/min.

* * * * *